(12) United States Patent
Huang et al.

(10) Patent No.: US 9,653,408 B2
(45) Date of Patent: May 16, 2017

(54) HIGH-FREQUENCY PACKAGE

(71) Applicant: WIN Semiconductors Corp., Tao Yuan (TW)

(72) Inventors: Chih-Wen Huang, Taoyuan (TW); Yu-Chiao Chen, Taipei (TW)

(73) Assignee: WIN Semiconductors Corp., Tao Yuan (TW)

( * ) Notice: Subject to any disclaimer, the term of this patent is extended or adjusted under 35 U.S.C. 154(b) by 0 days.

(21) Appl. No.: 14/883,609

(22) Filed: Oct. 14, 2015

(65) Prior Publication Data

US 2017/0047299 A1  Feb. 16, 2017

Related U.S. Application Data

(60) Provisional application No. 62/204,972, filed on Aug. 13, 2015.

(51) Int. Cl.
| | |
|---|---|
| *H01L 23/58* | (2006.01) |
| *H01L 23/552* | (2006.01) |
| *H01L 23/66* | (2006.01) |
| *H01L 23/00* | (2006.01) |
| *H01L 23/495* | (2006.01) |

(52) U.S. Cl.
CPC ........ *H01L 23/552* (2013.01); *H01L 23/4952* (2013.01); *H01L 23/49503* (2013.01); *H01L 23/49541* (2013.01); *H01L 23/49548* (2013.01); *H01L 23/66* (2013.01); *H01L 24/49* (2013.01); *H01L 2223/6611* (2013.01); *H01L 2223/6638* (2013.01); *H01L 2224/48247* (2013.01); *H01L 2924/30107* (2013.01)

(58) Field of Classification Search
CPC ............ H01L 23/66; H01L 23/49503; H01L 2223/6638; H01L 2223/6611
See application file for complete search history.

(56) References Cited

U.S. PATENT DOCUMENTS

| | | | |
|---|---|---|---|
| 5,057,805 A | 10/1991 | Kadowaki | |
| 5,677,570 A * | 10/1997 | Kondoh | ............ H01L 23/49503 257/690 |
| 5,808,325 A * | 9/1998 | Webb | .................... H01L 25/167 257/100 |
| 5,932,927 A | 8/1999 | Koizumi | |
| 6,239,669 B1 | 5/2001 | Koriyama | |
| 6,642,808 B2 | 11/2003 | Koriyama | |
| 6,661,101 B2 | 12/2003 | Hiraga | |
| 6,828,658 B2 | 12/2004 | Schmitz | |
| 6,936,921 B2 | 8/2005 | Yoshida | |

(Continued)

FOREIGN PATENT DOCUMENTS

| | | |
|---|---|---|
| TW | 200504964 | 2/2005 |
| TW | 200522318 | 7/2005 |

(Continued)

*Primary Examiner* — Victor A Mandala
(74) *Attorney, Agent, or Firm* — Winston Hsu; Scott Margo

(57) ABSTRACT

A high-frequency package comprises a die; a plurality of leads; and a die pad; wherein a surface of the die pad is lower than top surfaces of the plurality of leads, the die is disposed on the die pad with the lower surface, such that a top surface of the die is substantially aligned with the top surfaces of the plurality of leads.

8 Claims, 9 Drawing Sheets

(56) References Cited

U.S. PATENT DOCUMENTS

| | | | |
|---|---|---|---|
| 7,187,256 B2* | 3/2007 | Oran | H01L 23/66 |
| | | | 333/238 |
| 7,211,887 B2 | 5/2007 | Channabasappa | |
| 7,489,022 B2 | 2/2009 | Torkington | |
| 8,044,496 B2 | 10/2011 | Hsieh | |
| 8,912,664 B1 | 12/2014 | Liou | |
| 8,987,063 B2 | 3/2015 | Harata | |
| 8,999,755 B1 | 4/2015 | Liu | |
| 2001/0005039 A1* | 6/2001 | Russell | H01L 23/4951 |
| | | | 257/666 |
| 2003/0151113 A1* | 8/2003 | Hiraga | H01L 23/49805 |
| | | | 257/512 |
| 2005/0051877 A1* | 3/2005 | Hsu | H01L 21/4821 |
| | | | 257/667 |
| 2005/0184825 A1 | 8/2005 | Oran | |
| 2009/0159320 A1* | 6/2009 | Sanjuan | H01L 23/047 |
| | | | 174/260 |
| 2012/0051000 A1 | 3/2012 | Laidig et al. | |
| 2012/0208324 A1* | 8/2012 | Harata | H01L 23/49503 |
| | | | 438/123 |
| 2012/0218729 A1* | 8/2012 | Carey | H01L 21/561 |
| | | | 361/807 |
| 2014/0036471 A1 | 2/2014 | Yuen | |

FOREIGN PATENT DOCUMENTS

| | | |
|---|---|---|
| TW | 200625585 | 7/2006 |
| TW | 200939416 | 9/2009 |
| TW | 201010036 A1 | 3/2010 |
| TW | 201338114 A | 9/2013 |

* cited by examiner

HIGH-FREQUENCY PACKAGE

CROSS REFERENCE TO RELATED APPLICATIONS

This application claims the benefit of U.S. provisional application No. 62/204,972, filed on Aug. 13, 2015 and incorporated herein by reference.

BACKGROUND OF THE INVENTION

1. Field of the Invention

The present invention relates to a high-frequency package, and more particularly, to a high-frequency package capable of reducing high-frequency loss.

2. Description of the Prior Art

Future mobile communication systems and satellite communication systems are usually required to operate at high frequencies. However, a traditional package is not customized for the high-frequency operation. Significant loss is caused at high frequencies, and degrades performance of the package. In detail, in the traditional package, a wire bonding is performed to connect a die with leads via bonding wires. After the wires are bonded, a molding process is performed. Since the molding compound is usually made of a lossy material, an inductive effect is unavoidable and a serious loss at high frequencies is caused.

For example, please refer to FIGS. 1A-1C, which are schematic diagrams of a sectional side view, a top view and a bottom view of a package 10 in the prior art. In the package 10, a die 100 is bonded on a die pad 102 and connected to leads 104 via bonding wires 106. The bonding wires 106 and the leads 104 would be covered by a molding compound after the molding process, and thus, inductance is formed around the bonding wires 106 and the leads 104. Notably, a top surface of the die 100 is not coplanar with a top surface of the adjacent leads 104, such that the bonding wires 106 is required to be sufficiently long, which causes a significant inductive effect and brings a serious loss at high frequencies.

Therefore, it is necessary to improve the prior art.

SUMMARY OF THE INVENTION

It is therefore a primary objective of the present invention to provide a high-frequency package capable of reducing high-frequency loss, to improve over disadvantages of the prior art.

The present invention discloses a high-frequency package. The high-frequency package comprises a die; a plurality of leads; and a die pad; wherein a surface of the die pad is lower than top surfaces of the plurality of leads, the die is disposed on the die pad with the lower surface, such that a top surface of the die is substantially aligned with the top surfaces of the plurality of leads.

These and other objectives of the present invention will no doubt become obvious to those of ordinary skill in the art after reading the following detailed description of the preferred embodiment that is illustrated in the various figures and drawings.

DETAILED DESCRIPTION

Figure 1A:
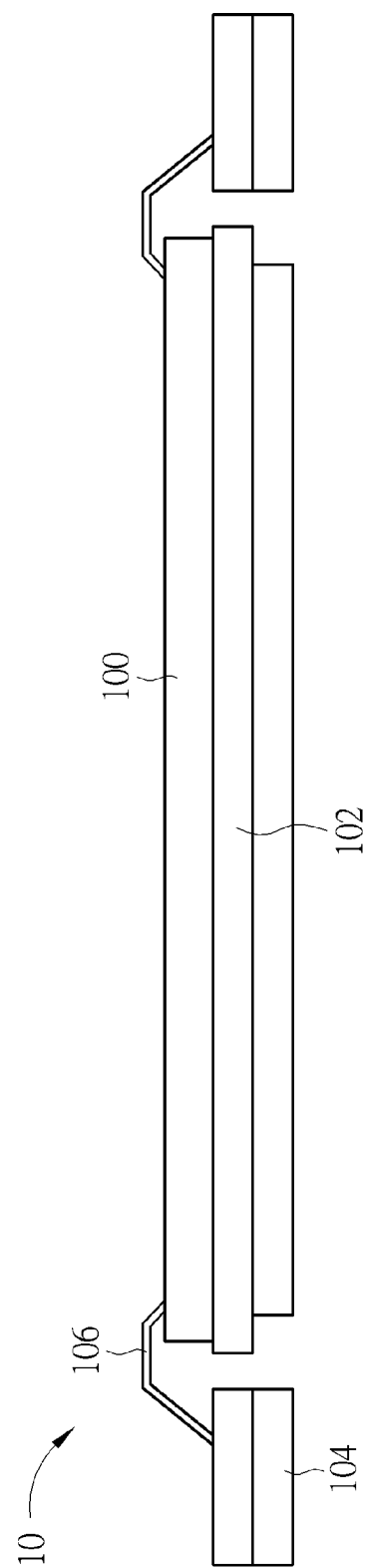
FIGS. 1A-1C are schematic diagrams of a sectional side view, a top view, and a bottom view, respectively, of a package in the prior art.
Figure 1B:
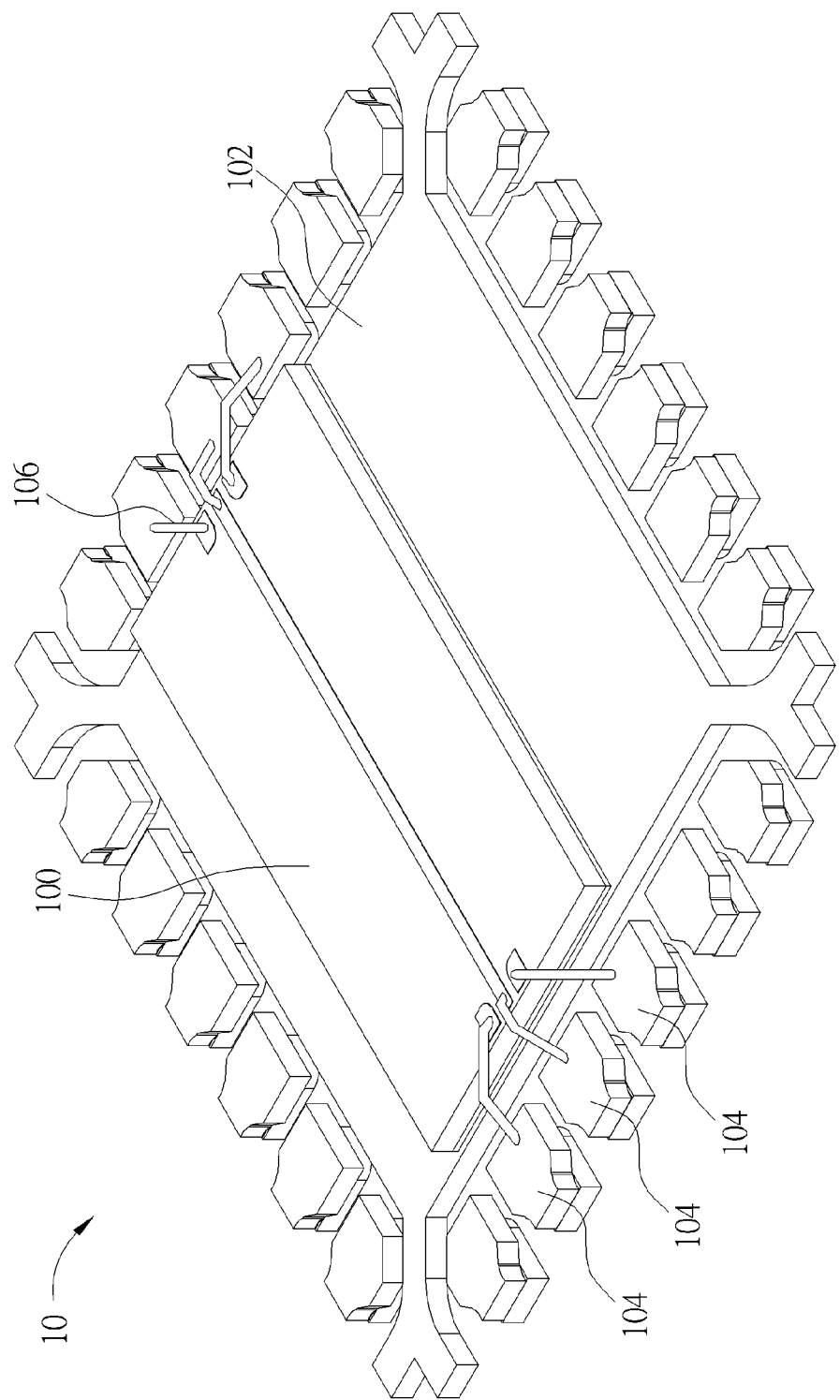
Figure 1C:
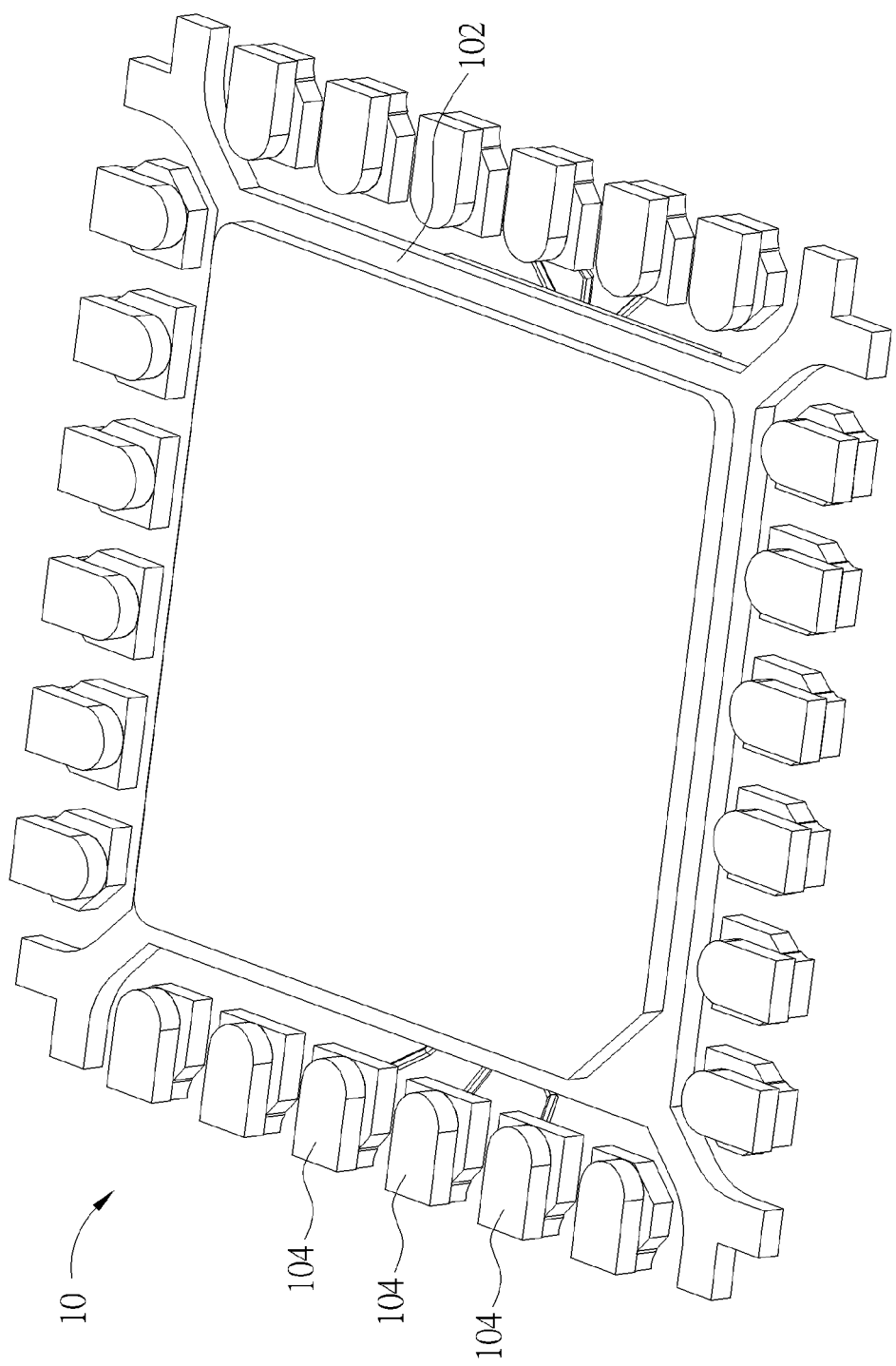
Figure 2:
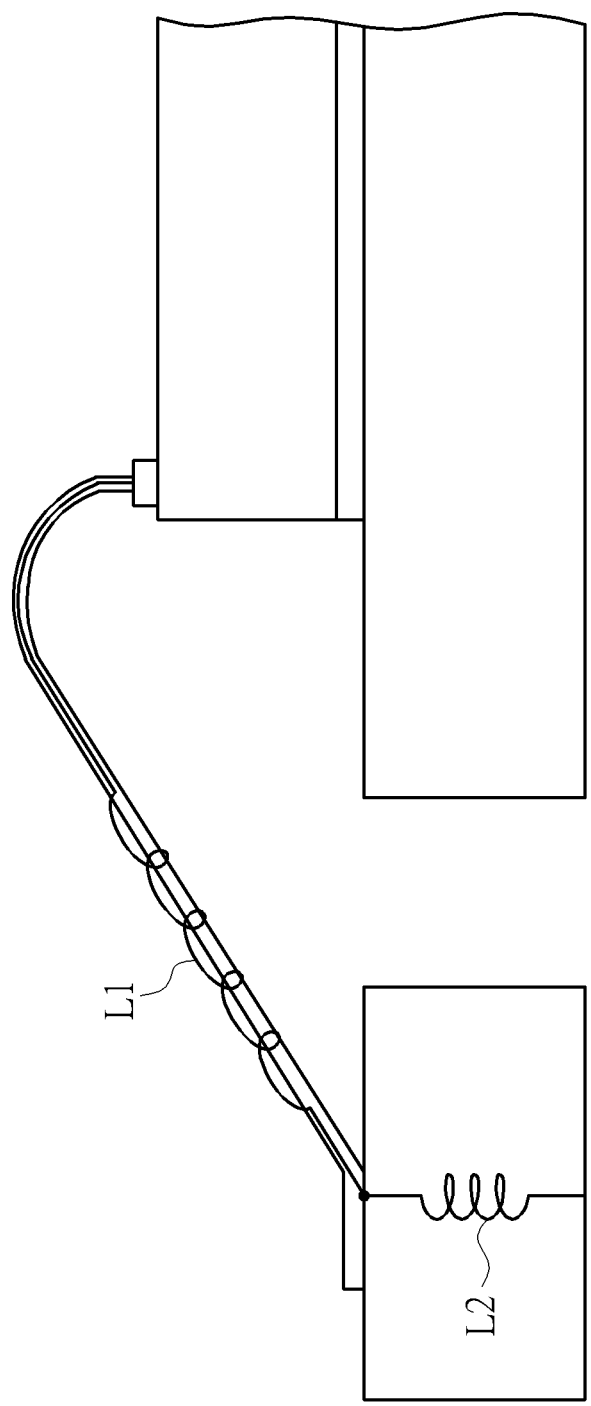
FIG. 2 is a schematic diagram of a circuit model of a package.

Inductance formed around the bonding wires and the leads is illustrated in FIG. 2, a schematic diagram of a circuit model of a package. In FIG. 2, an inductance L1 represents an inductance around the bonding wires, and an inductance L2 represents an inductance around the leads. Reducing either the inductance L1 or the inductance L2 (or the both) would alleviate transmission loss and enhance package performance at high frequencies.

Figure 3A:
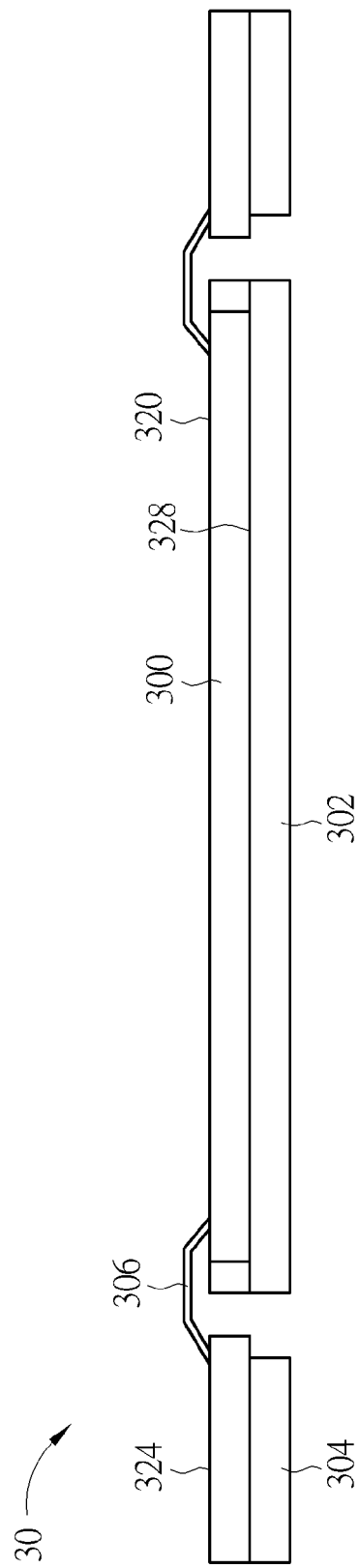
FIGS. 3A-3C are schematic diagrams of a sectional side view, a top view, and a bottom view, respectively, of a high-frequency package according to an embodiment of the present invention.
Figure 3B:
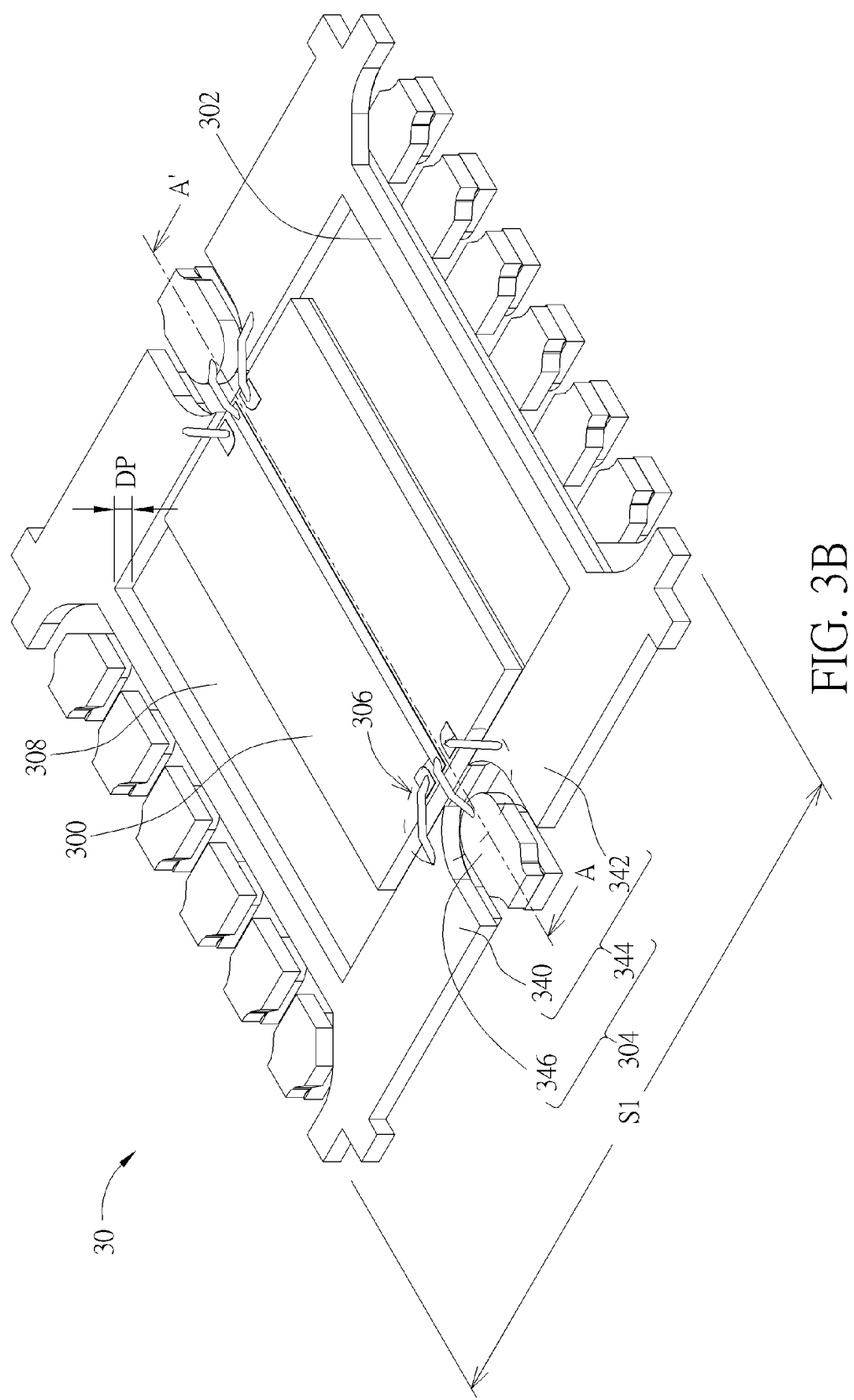
Figure 3C:
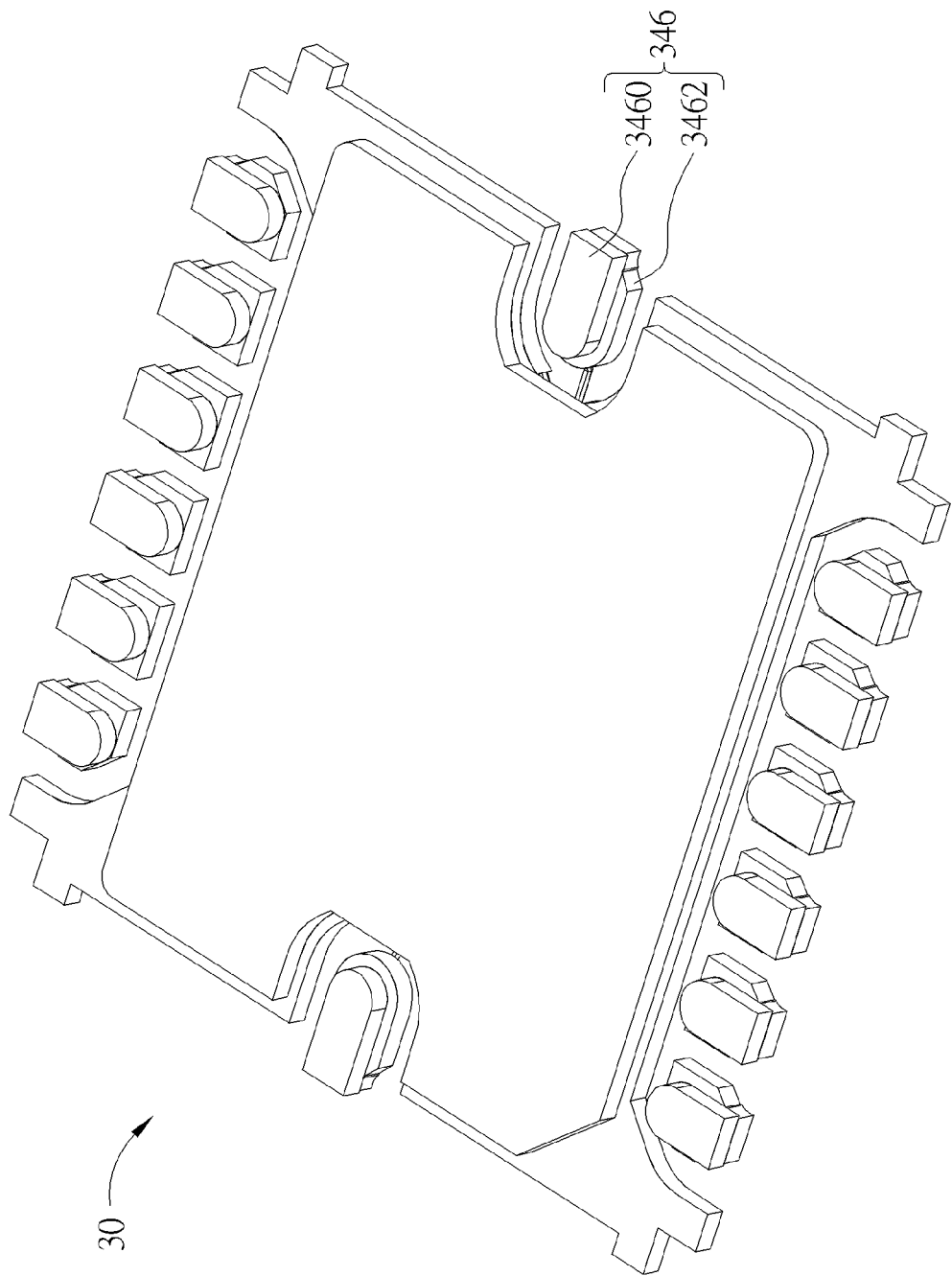

FIGS. 3A-3C are schematic diagrams of a sectional side view, a top view and a bottom view of a high-frequency package 30 according to an embodiment of the present invention, where FIG. 3A illustrates the sectional side view of the high-frequency package 30 along an A-A' line (in FIG. 3B). The high-frequency package 30 comprises a die 300, a die pad 302, leads 304, and bonding wires 306. The die 300 is disposed on the die pad 302, and the bonding wires 306 connect the die 300 and the leads 304. A notched area 308 with a notched depth DP is formed on the die pad 302, such that a surface 328 of the die pad 302 is lower than top surfaces 324 of the leads 304. When the die 300 is disposed within the notched area 308, a top surface 320 of the die 300 is substantially aligned (coplanar) with the top surfaces 324 of the leads 304. In such a situation, lengths of the bonding wires 306 are shortened. In other words, the notched area 308 and the notched depth DP are configured to substantially align the top surface 320 of the die 300 with the top surfaces 324 of the leads 304, such that lengths of the bonding wires 306 are shortened and the inductance L1 of the high-frequency package 30 is reduced.

Specifically, in order to shorten the lengths of the bonding wires 306, the notched depth DP of the notched area 308 is designed to accommodate a thickness of the die 300 such that a difference in a horizontal level between the top surface 320 of the die 300 and the top surfaces 324 of the leads 304 is smaller than a specific value. The specific value is suggested to be 60% of the thickness of the die 300. Since the lengths of the bonding wires 306 are shortened, the inductance L1 around the bonding wires 306 is effectively reduced. Preferably, the top surface of the die 300 is coplanar with the top surfaces of the leads 304, and not limited thereto.

As can be seen, shortening the lengths of the bonding wires, by forming the notched area with the notched depth and disposing the die within the notched area, would effectively reduce the inductance L1 around the bonding wires of the high-frequency package.

In addition, to reduce the inductance L2 around the leads, the leads may be properly designed as transmission lines. As FIG. 3B shows, a signal lead 346, on a side S1 of the high-frequency package 30, is connected to the die 300 and configured to deliver signals of the die 300. The rest of leads on the side S1 are integrated as a ground lead 344. The ground lead 344, connected to a ground of the die 300, occupies the entire side S1 of the high-frequency package 30. Hence, the inductance L2 around the leads is reduced. In addition, as FIG. 3C shows, the signal lead 346 comprises an upper signal portion 3462 and a lower signal portion 3460. The lower signal portion 3460 has a narrower area than the upper signal portion 3462, such that the molding compound may have a better catching capability on the signal lead 346 after the molding process is performed.

Furthermore, a slot is formed within the ground lead 344, and the signal lead 346 is disposed within the slot. In other words, the ground lead 344 is separated from the signal lead 346 and surrounds the signal lead 346. The ground lead 344 may comprise ground segments 340, 342. The ground segments 340, 342 are connected to the ground of the die 300 and surround the signal lead 346. The ground segments 340, 342 are held at a same ground voltage level. Preferably, a top surface of the ground lead 344 and a top surface of the signal lead 346 are at a same level. Therefore, the ground lead 344 and the signal lead 346 form as a ground-signal-ground (GSG) structure, which further enhances the high-frequency performance of the high-frequency package 30. Furthermore, the bonding wire 306 connecting the die 300 and the ground lead 344 is disposed between the bonding wires 306 connecting the die 300 and the signal lead 346, which means that the bonding wires 306 also form as a GSG structure so as to enhance the high-frequency performance of the high-frequency package 30.

Figure 4:
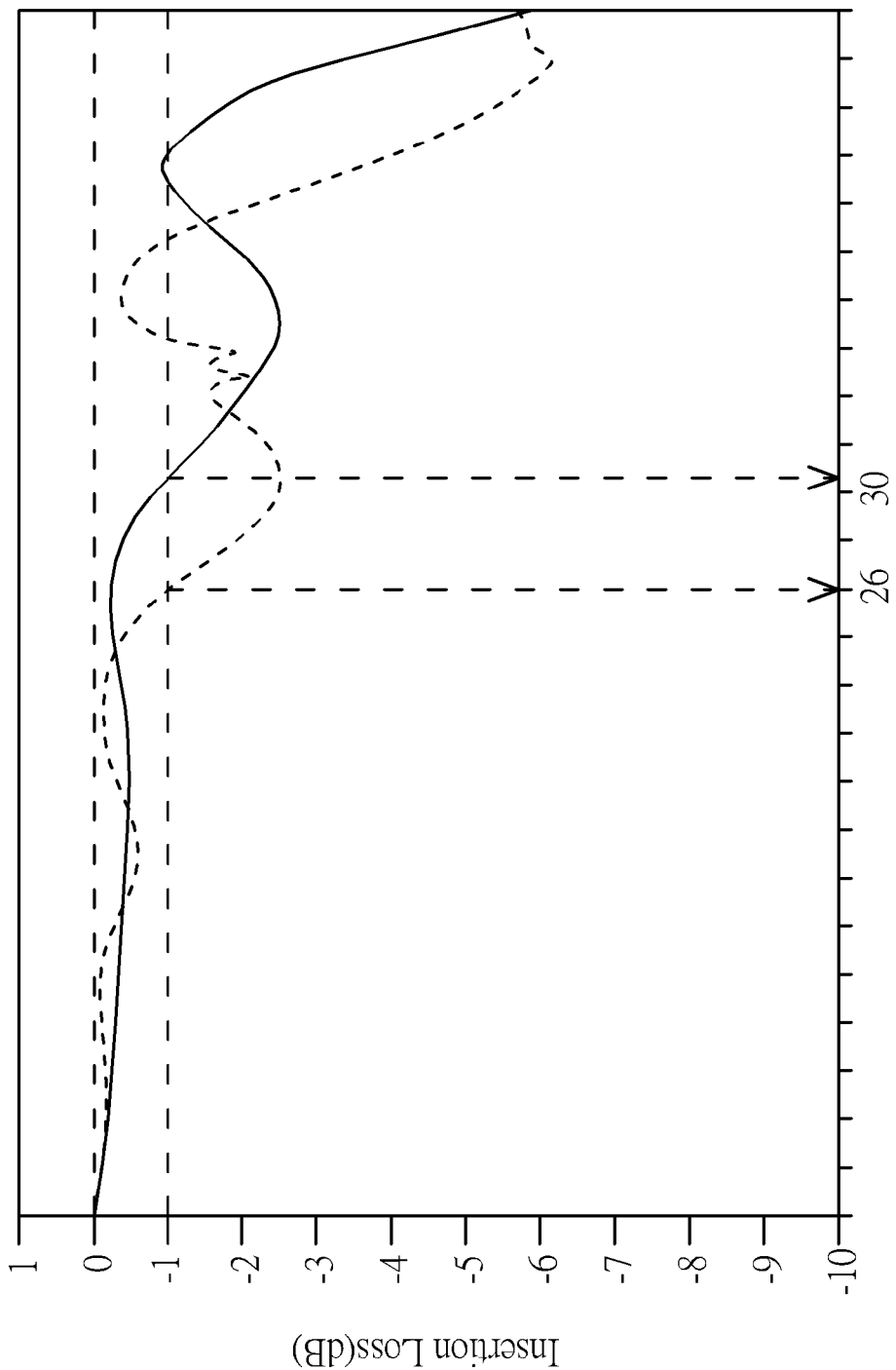
FIG. 4 is a frequency response diagram of transmission coefficient.

The high-frequency performance of the high-frequency package 30 may be evaluated by a frequency response diagram of insertion loss (i.e., the scattering parameter $S_{21}$) of the package 10 and the high-frequency package 30, as shown in FIG. 4. In FIG. 4, a dashed line represents the frequency response of insertion loss of the package 10, and a solid line represents that of the high-frequency package 30. As can be seen from FIG. 4, a characteristic frequency (at which the insertion loss is 1 dB) of the package 10 is only 26 GHz. By shortening the bonding wires 306 using the notched area 308 and forming the leads as the GSG structure of transmission line, a characteristic frequency of the high-frequency package 30 is improved to approach 31 GHz (more than 30 GHz). In addition, ripples in frequency response under the characteristic frequency of the high-frequency package 30 are minor than the package 10, which benefits an operation of the high-frequency package 30.

Notably, the embodiments stated in the above are utilized for illustrating the concept of the present invention. Those skilled in the art may make modifications and alternations accordingly, and not limited herein. For example, methods of forming the notched area are not limited. The notched area is formed by either topside etching or backside etching, and not limited herein. In addition, the signal lead and the ground lead may be realized using microstrip line or coplanar waveguide, and not limited herein.

In addition, the die pad 302 is not limited to having the notched area 308 formed therein. The die pad may be downset. As long as the surface 328 of the die pad is lower than the top surfaces 324 of the leads 304 such that the top surface 320 of the die 300 is substantially aligned (coplanar) with the top surfaces 324 of the leads 304, the requirements of the present invention is satisfied.

Figure 5:
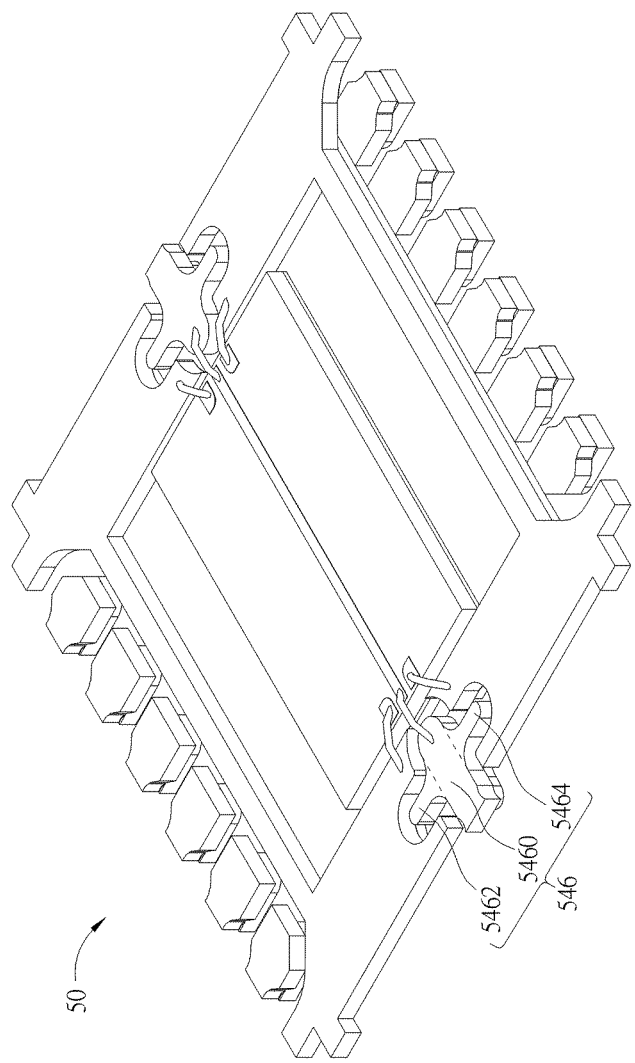
FIG. 5 is a schematic diagram of a top view of a high-frequency package according to an embodiment of the present invention.

In addition, a shape of the signal lead is not limited. The shape of the signal lead may be modified according to the practical situation. For example, please refer to FIG. 5, which is a schematic diagram of a top view of a high-frequency package 50 according to an embodiment of the present invention. A signal lead 546 of the high-frequency package 50 may comprise protrusions 5462, 5464. The protrusions 5462, 5464 protrude from a central portion 5460 of the signal lead 546. The protrusions 5462, 5464 may form a capacitance effect of transmission line, which may further enhance the high-frequency performance of the high-frequency package.

In summary, the high-frequency package of the present invention utilizes the notched area formed on the die pad to align the top surface of the die with the top surface of the leads, so as to shorten the lengths of the bonding wires. In addition, the signal lead and the ground lead are form as the GSG structure of transmission line, which further improves the high-frequency performance of the high-frequency package.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A high-frequency package, comprising:
   a die;
   a plurality of leads; and
   a die pad, wherein a surface of the die pad is lower than top surfaces of the plurality of leads;
   wherein the die is disposed on the die pad, such that a top surface of the die is coplanar with the top surfaces of the plurality of leads;
   wherein the plurality of leads are formed as transmission lines.

2. The high-frequency package of claim 1, wherein the die pad comprises a notched area with a notched depth, and the die is disposed within the notched area, such that the top surface of the die is coplanar with the top surfaces of the plurality of leads.

3. The high-frequency package of claim 1, further comprising:
   a plurality of bonding wires, connecting the die and the plurality of leads.

4. The high-frequency package of claim 3, wherein the plurality of bonding wires form as a ground-signal-ground structure.

5. The high-frequency package of claim 1, wherein the plurality of leads comprises:
   a ground lead, connected to a ground of the die, occupying a side of the high-frequency package, wherein a slot is formed within the ground lead;
   a signal lead, disposed within the slot;
   wherein the ground lead surrounds the signal lead, and the ground lead and the signal lead form as a ground-signal-ground structure.

6. The high-frequency package of claim 5, wherein the ground lead is separated from the signal lead.

7. The high-frequency package of claim 5, wherein a top surface of the ground lead and a top surface of the signal lead are at a same level.

8. The high-frequency package of claim 5, wherein the ground lead comprises a first ground segment and a second ground segment, and the first ground segment and the second ground segment are connected to the ground of the die and surround the signal lead.

* * * * *